(12) United States Patent
Shudarek et al.

(10) Patent No.: US 9,083,234 B2
(45) Date of Patent: Jul. 14, 2015

(54) DRIVE OUTPUT HARMONIC MITIGATION DEVICES AND METHODS OF USE THEREOF

(71) Applicants: Todd Shudarek, West Bend, WI (US); Joel Mertes, Menomonee Falls, WI (US)

(72) Inventors: Todd Shudarek, West Bend, WI (US); Joel Mertes, Menomonee Falls, WI (US)

(73) Assignee: MTE Corporation, Menomonee Falls, WI (US)

( * ) Notice: Subject to any disclaimer, the term of this patent is extended or adjusted under 35 U.S.C. 154(b) by 0 days.

(21) Appl. No.: 14/249,043

(22) Filed: Apr. 9, 2014

(65) Prior Publication Data

US 2014/0300433 A1    Oct. 9, 2014

Related U.S. Application Data

(60) Provisional application No. 61/809,963, filed on Apr. 9, 2013.

(51) Int. Cl.
*H03H 7/00* (2006.01)
*H02M 1/12* (2006.01)

(52) U.S. Cl.
CPC .................................. *H02M 1/126* (2013.01)

(58) Field of Classification Search
CPC . H03K 17/163; H03K 17/168; H03K 17/567; H03K 17/687; H03K 17/0406; H03K 17/0828; H02M 7/04; H02M 7/42; H02M 7/062; H02M 7/487; H02M 7/493; H02M 7/538; H02M 7/5383
USPC ................... 333/119, 167, 177, 181
See application file for complete search history.

(56) References Cited

U.S. PATENT DOCUMENTS

| | | | |
|---|---|---|---|
| 6,208,537 B1 | 3/2001 | Skibinski et al. | |
| 8,193,756 B2 | 6/2012 | Jadric et al. | |
| 2004/0066253 A1 | 4/2004 | Lauri | |
| 2009/0257252 A1* | 10/2009 | Schubert | 363/39 |
| 2010/0156194 A1 | 6/2010 | Navid et al. | |
| 2012/0256719 A1 | 10/2012 | Shudarek et al. | |

FOREIGN PATENT DOCUMENTS

| | | | |
|---|---|---|---|
| EP | 2 249 477 A1 | 10/2010 | |
| EP | 2249477 A1 * | 11/2010 | H03H 1/00 |

OTHER PUBLICATIONS

PCT Application Request filed Apr. 9, 2014.
English abstract of EP 2249477 A1 "Power Supply System for Electric Motors Containing Passive Filter With Coupled Coils" filed Mar. 25, 2010.
PCT Notification of Transmittal of The International Search Report and The Written Opinion of the International Searching Authority dated Aug. 19, 2014 on International Application No. PCT/US2014/033523 filed on Apr. 9, 2014.

* cited by examiner

*Primary Examiner* — John Poos
*Assistant Examiner* — David Mattison
(74) *Attorney, Agent, or Firm* — Greenberg Traurig, LLP (57) ABSTRACT

A filter for filtering a three-phase electrical power waveform produces a three-phase output power waveform. The filter has an inductor with three sets of first and second coils, each having a capacitor connected in series therewith. Each of the three sets of first and second coils has a tap intermediate the first and second coils where the output waveform is present, each tap capable of being connected to a load. In some embodiments, the inductor is passive adaptive and includes resistors for reducing current in-rush.

16 Claims, 7 Drawing Sheets

DRIVE OUTPUT HARMONIC MITIGATION DEVICES AND METHODS OF USE THEREOF

CROSS-REFERENCE TO RELATED APPLICATIONS

The present application claims the benefit of U.S. Provisional Application No. 61/809,963, entitled Drive Harmonic Mitigation Devices and Methods of Use Thereof, filed on Apr. 9, 2013, the disclosure of which is incorporated herein by reference in its entirety for all purposes.

FIELD

The present invention relates to conditioning of an electrical power signal, and more particularly, to apparatus and methods for reshaping an electrical power output waveform generated by a first device and presenting the altered waveform to another device or circuit.

BACKGROUND

Circuits for altering electrical power waveforms are known. For example, L-R-C (inductor-resistor-capacitor) low pass filters and sine wave filters are known for use in altering a power output from a variable speed drive for an electric motor, e.g., for conditioning a pulse width modulated output in order to supply the motor with a more sinusoidal power waveform. Notwithstanding, improved and/or alternative power conditioning circuits remain desirable.

SUMMARY

The disclosed subject matter relates to a device for modifying an input electrical waveform generated by a source of electrical power provided on a first conductor. The device includes a first inductor capable of connecting to the first conductor. A second inductor is connected in series to the first inductor distal to the first conductor and a capacitor is connected in series with the second inductor distal to the first inductor. A second conductor is connected between the first inductor and the second inductor, the second conductor capable of presenting an output waveform.

In another embodiment of the present disclosure, a relative polarity between the first inductor and the second inductor is additive.

In another embodiment of the present disclosure, the input electrical waveform is a first electrical waveform and wherein the source of electrical power produces a plurality of electrical waveforms, each provided on one of a plurality of conductors and further comprising a plurality of devices, each having a first inductor capable of connecting to one of the plurality of conductors, a second inductor connected in series to the first inductor, a capacitor connected in series with the second inductor distal to the first inductor and a plurality of second conductors connected between the first inductor and the second inductor, the plurality of second conductors capable of presenting a multi-phase output waveform.

In another embodiment of the present disclosure, the plurality of electrical waveforms is three in number, each having a different phase to provide three-phase electrical power at three second conductors.

In another embodiment of the present disclosure, the first inductor and the second inductor are disposed on a common core.

In another embodiment of the present disclosure, each of the series connected first inductors and second inductors are disposed on a common core.

In another embodiment of the present disclosure, the source of electrical power is an adjustable speed drive.

In another embodiment of the present disclosure, the source of electrical power produces the input electrical waveform by pulse-width modulation.

In another embodiment of the present disclosure, the output waveform is supplied to an electric motor.

In another embodiment of the present disclosure, the device reduces harmonic currents otherwise present absent the second inductor.

In another embodiment of the present disclosure, a resistor is interposed between and in series with the second inductor and the capacitor.

In another embodiment of the present disclosure, at least one of the first and second inductors is an adaptive passive inductor.

In another embodiment of the present disclosure, each of the first and second inductors is an adaptive passive inductor.

In another embodiment of the present disclosure, the device has an E-shaped core, each of the first and second inductors being wound about a corresponding leg of the E-shaped core and further comprising an I-shaped core disposed proximate the ends of each leg of the E-shaped core and further comprising a high permeability core gap piece disposed between each leg of the E-shaped core and the I-shaped core.

In another embodiment of the present disclosure, a filter for filtering an input electrical power waveform produces an output power waveform. The filter has an inductor having first and second coils and a capacitor connected in series. The filter has a tap terminal intermediate the first and second inductors. A conductor extends from the tap terminal and is capable of being connected to a load.

In another embodiment of the present disclosure, the input electrical power is provided by an adjustable speed drive and the load is a motor.

In another embodiment of the present disclosure, the inductor is of the passive adaptive type and further comprising a resistor connected in series between the inductor and the capacitor.

In another embodiment of the present disclosure, a filter for filtering a three-phase electrical power waveform produces a three-phase output power waveform. The filter has an inductor having three sets of first and second coils, each having a capacitor connected in series therewith. Each of the capacitors are connected in common distal to the series connection with the second coil. Each of the three sets of first and second inductors having a tap intermediate the first and second inductors where the output waveform is present, each tap capable of being connected to a load.

In another embodiment of the present disclosure, the inductor is passive adaptive and further comprising a resistor connected in series between the inductor and the capacitor, the load being a three-phase electric motor.

In another embodiment of the present disclosure, the inductor is formed on an E-shaped core each of the three sets of coils being wound on a corresponding leg of the E shape.

In another embodiment of the present disclosure, the device has a three phase core, each of the first and second inductors being wound about a corresponding portion of the three phase core.

BRIEF DESCRIPTION OF THE DRAWINGS

For a more complete understanding of the present disclosure, reference is made to the following detailed description of exemplary embodiments considered in conjunction with the accompanying drawings.

DETAILED DESCRIPTION OF EXEMPLARY EMBODIMENTS

An aspect of the present disclosure is the use of the apparatus disclosed herein for drive output filters that provide a nearly sinusoidal output voltage when driven from variable frequency drives or other types of Pulse-width modulation (PWM) inverters with switching frequencies from 2 kHz to 8 kHz. In some embodiments, the apparatus of the present disclosure are utilized to eliminate and/or minimize the problem of motor/cable insulation failures, heating, and/or audible noise. In some embodiments, the apparatus disclosed by the present disclosure are utilized to reduce electromagnetic interference (EMI) by eliminating the high dV/dt associated with inverter output waveforms. In some embodiments, added cable protection and the economy of using standard grade electrical wire is a significant benefit of using the sine wave filters of the present disclosure to protect against long lead drive-to-motor excess voltage problems.

Figure 1:
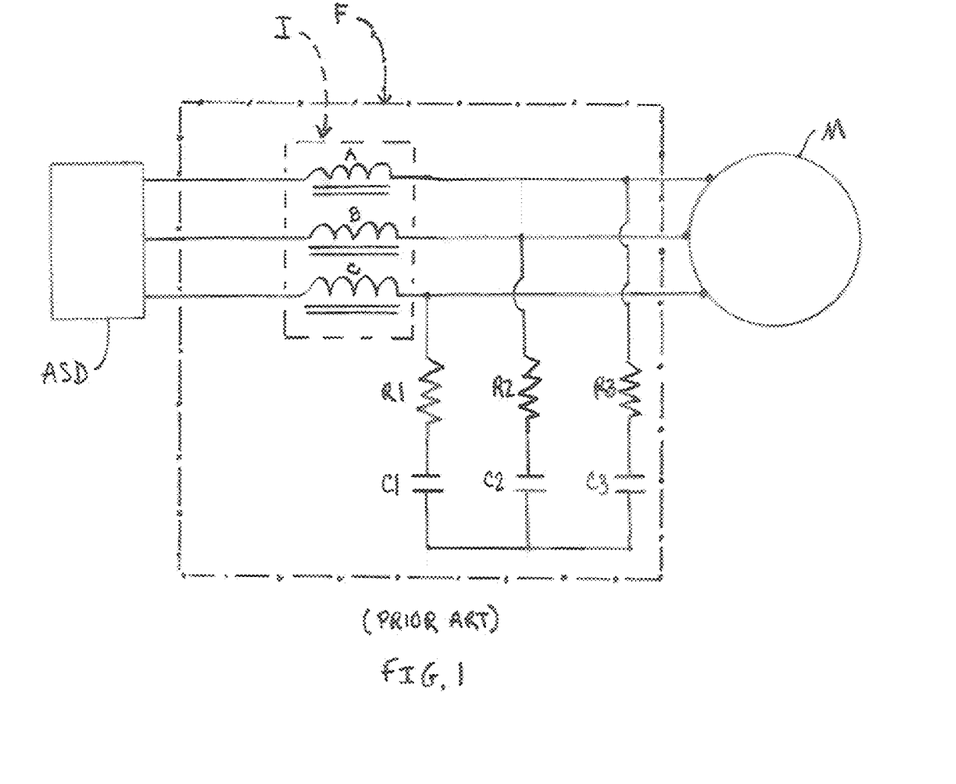
FIG. 1 is circuit diagram of a prior art sine wave filter.

FIG. 1 shows a prior art L-R-C (inductor-resistor-capacitor) low pass drive output filter F. Such filters may also be known as Sine wave filters. Prior art Sine wave filters may shunt a high PWM switching frequency (typically 2 kHz to 8 kHz), e.g., from an adjustable speed drive (ASD) through capacitors C1, C2, C3 and provides primarily just the fundamental voltage waveform to a motor (typically 10 or 120 Hz). In some instances, a three phase inductor I is tuned with a capacitor(s) C1, C2, C3 below the drive switching frequency. In some instances, a resistor or resistors R1, R2, R3 may be used to provide damping, to increase filter stability and reduce the initial inrush of current to the filter F when the drive ASD is first turned on. An aspect of the present disclosure is the recognition that prior art approaches may employ a trade-off between inductor size and capacitance value. More particularly, because the inductor is made from copper windings, it is typically the most expensive part of the filter. As a result, there is an incentive to reduce the size of the inductor, but this has the undesirable effect of lowering its inductance. To compensate for the lowered inductance, the capacitance value of the capacitor is increased to maintain the same low pass filter cutoff frequency. This can result in an increase in the harmonic currents through the inductor and the capacitor. Increases in harmonic current increase power losses within the inductor, with the electrical power being converted to waste heat and mechanical vibration. The increased winding losses in the inductor conductors may be due to proximity effects, gap heating, and skin effect heating associated with increased harmonic current. These factors represent a limitation on the reduction of inductor size, in that the inductor size may need to be maintained at a certain minimum to reduce the flux density in the core to reduce power losses to an acceptable level or a more expensive, lower loss core material may need to be used.

Figure 2:
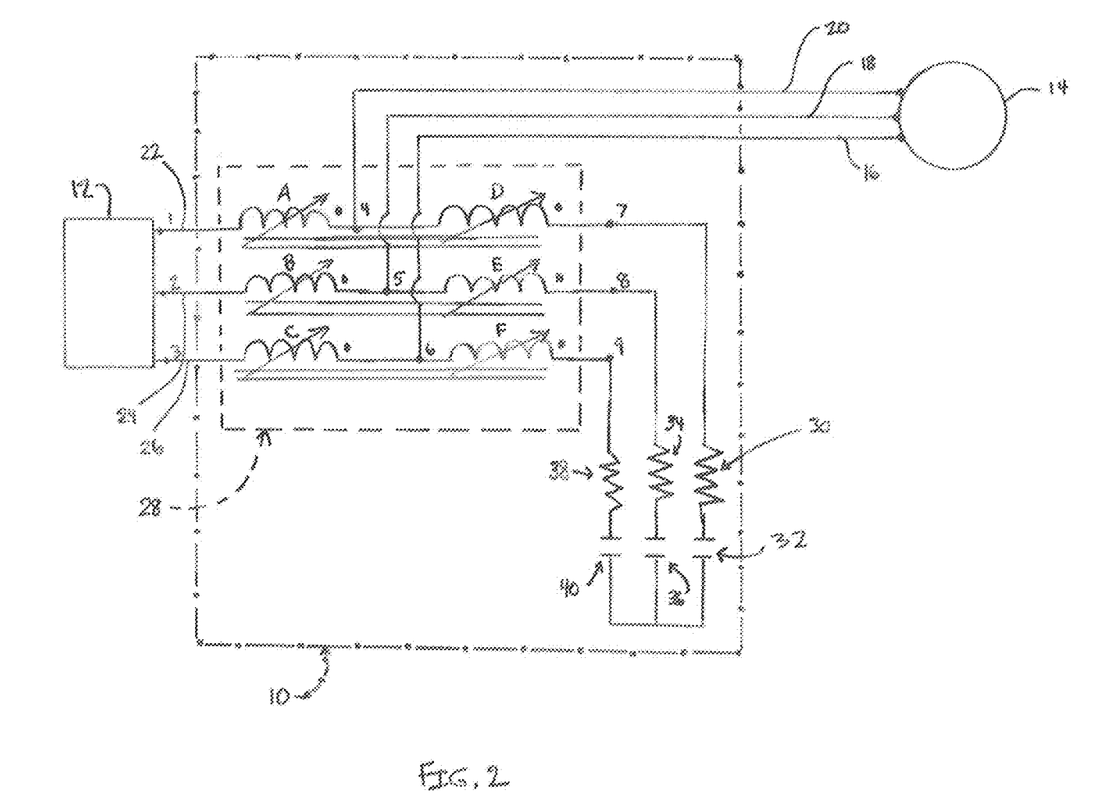
FIG. 2 is a circuit diagram of a sine wave filter in accordance with a first embodiment of the present disclosure.
Figure 3:
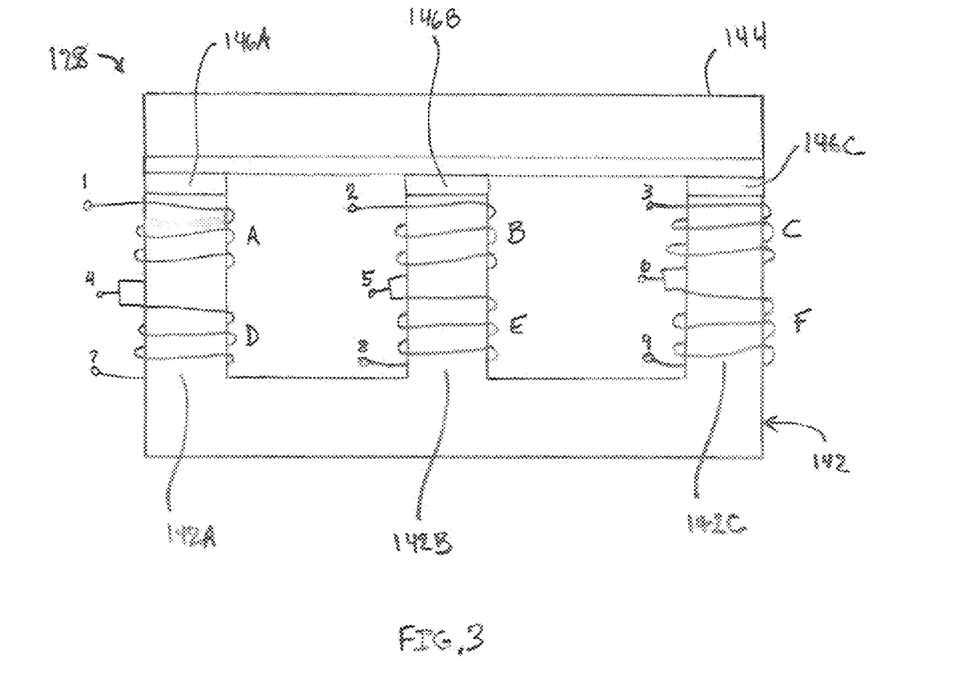
FIG. 3 is a schematic circuit diagram of an inductor that may be used with a sine wave filter in accordance with another embodiment of the present disclosure.

FIG. 2 shows a filter 10 in accordance with an embodiment of the present disclosure interposed between an adjustable speed drive ASD 12 and a motor 14. The ASD 12 would receive electrical power from, e.g., a power grid or a generator (not shown). The motor 14 has a three phase input as indicated by lines 16, 18, 20 and the ASD has a three phase output, as indicated by lines 22, 24, 26. An inductor 28 intermediates between the ASD 12 and the motor 14. The inductor 28 may be of the passive adaptive type, as shown in FIG. 3 below. The filter 10, may permit reducing inductor size, while avoiding the above-mentioned issues pertaining to winding losses, harmonic currents, etc., outlined above associated with reducing the size of the typical L-R-C filter. This greater latitude in reducing inductor 28 size is due in part to the arrangement of the coils A, B, C, D, E, F and the connections of the motor lines 16, 18, 20 to tap terminals 4, 5, 6 intermediate windings A and D, B and E and C and F, respectively. The inductor 28 is coupled to the ASD at terminals 1, 2 and 3 and has a plurality of windings A, B, C, D, E, F, each of which have a variable inductance attributable to the inductor 28 being of a passive adaptive type. Terminals 7, 8, 9 at the end of windings D, E, and F, respectively, connect to resister-capacitor couples 30 and 32, 34 and 36 and 38 and 40, respectively. The polarity of windings A, B, C with respect to D, E, F are shown by a dot.

FIG. 3 shows an inductor 128 that may be utilized in filter 10 of FIG. 2. The inductor 128 has an E-shaped core 142 and an I-shaped core element 144, both of which may be made from core steel. The windings A and D, B and E and C and F are disposed around the three arms 142A, 142B and 142C of the E-shaped core 142, respectively. The terminals 1-9 referred to above in FIG. 2 are also shown in FIG. 3. High permeability core gap pieces, "FAPS" 146A, 146B, 146C, as described in U.S. Patent Publication No. 20120256719, entitled "Harmonic Mitigation Devices and Applications Thereof," to Shudarek et al., which is incorporated by reference herein for all purposes, may be interposed between each of the arms 142A, 142B, 142C and the I-shaped element 144. The FAPS have the effect of providing adaptive passive inductance as indicated by the arrow symbols on the coils A, B, C, D, E, F in FIG. 2. When an inductor, like inductor 128 of FIG. 3, is used in the filter 10 of FIG. 2, windings A, B and C are coupled to windings D, E and F with the polarities indicated in FIG. 2 to increase the inductance tuned with the capacitor. In the embodiment of FIG. 2, the capacitors 32, 36, 40 will only need to be rated for a reduced current as compared to the typical filter (See FIG. 1) with just three coils, e.g., A, B and C. In some embodiments, the D, E and F windings only need to be rated for the capacitor current opposed to the A, B and C windings which have to be rated for the full motor current. In some embodiments, the D, E and F windings add relatively minor cost and size to the filter 10. In some embodiments, the voltage insertion loss of the filter is also reduced since only windings A, B and C are in series with the motor 14 and not windings D, E and F. While the inductor 28, 128 of FIG. 3 shows a variable inductance by coils A, B, C, D, E, F, attributable to the use of FAPS, an inductor made without FAPS, such as described in U.S. Pat. No. 7,142,081 may be used for some applications. The inductor 28, 128 may have a three phase configuration other than an EI configuration as described above relative to FIG. 3. For example, the inductor 28, 128 may have multiple gaps per leg.

Figure 4:
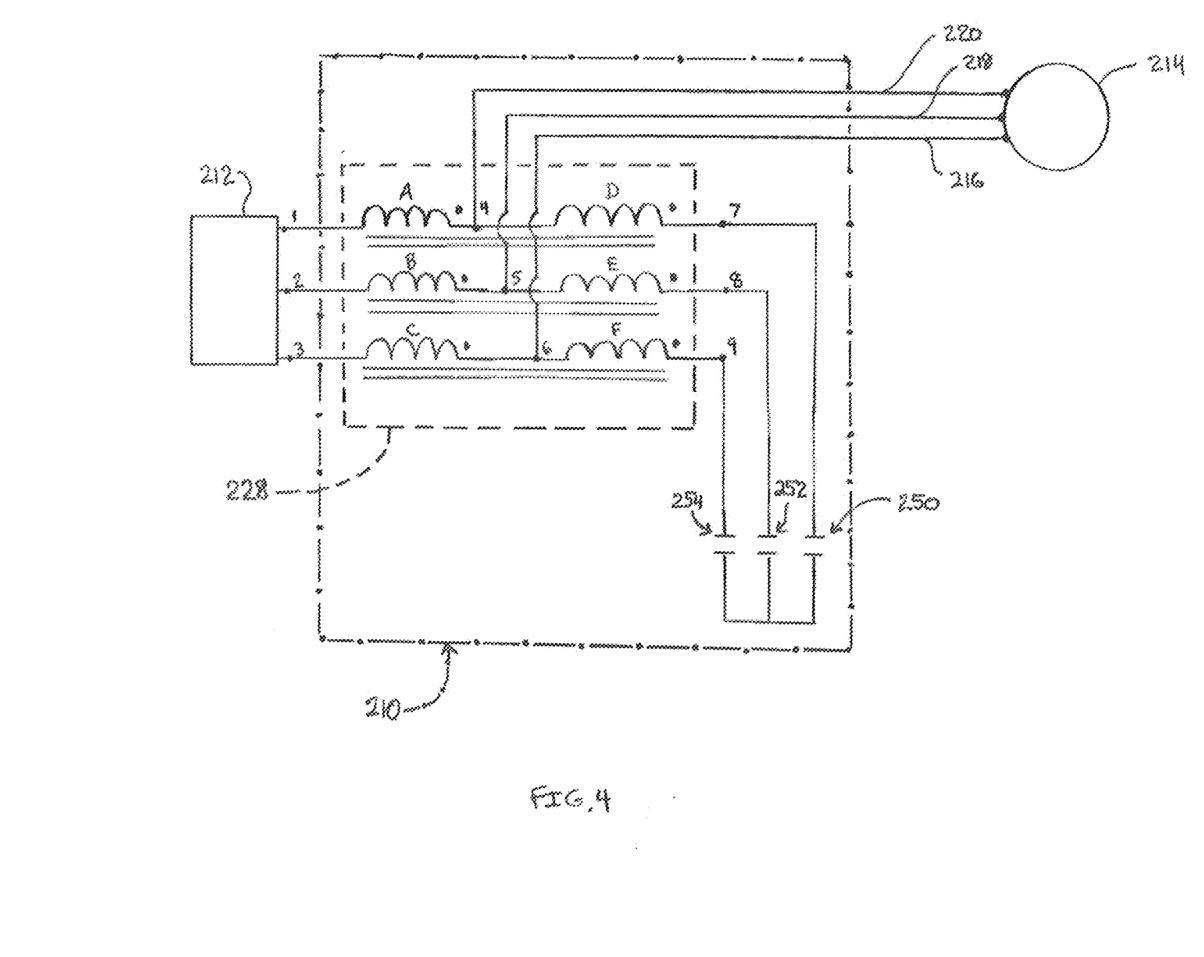
FIG. 4 is a circuit diagram of a sine wave filter in accordance with another embodiment of the present disclosure.

Some embodiments, e.g., as illustrated by filter 10 of FIG. 2, may require damping e.g., by resistors 30, 34, 38 to reduce inrush when the filter 10 is first energized to reduce ringing near the resonant frequency of the filter 10 during operation. Alternatively, in some applications, the filter 10 may not require additional damping. FIG. 4 shows a filter 210 in accordance with an embodiment of the present disclosure without damping resistors like 30, 34, 38 or the adaptive passive inductor 28 utilized in the embodiment of FIG. 2. The inductor 228 of FIG. 4 is similar to the one shown in FIGS. 2 and 3 but without the FAPS. The arrangement of the coils A, B, C, D, E, F and the connections of the motor lines 216, 218, 220 to tap terminals 4, 5, 6 intermediate windings A and D, B and E and C and F, respectively, is the same as in FIGS. 2 and 3. The inductor 228 is coupled to the ASD 212 at terminals 1, 2 and 3. Each individual coil, D, E, and F, displays self-inductance and additional, mutual inductances from the other five coils and may each be tuned with the capacitors 250, 252, 254, respectively, to the switching frequency of the ASD drive 212.

Figure 5:
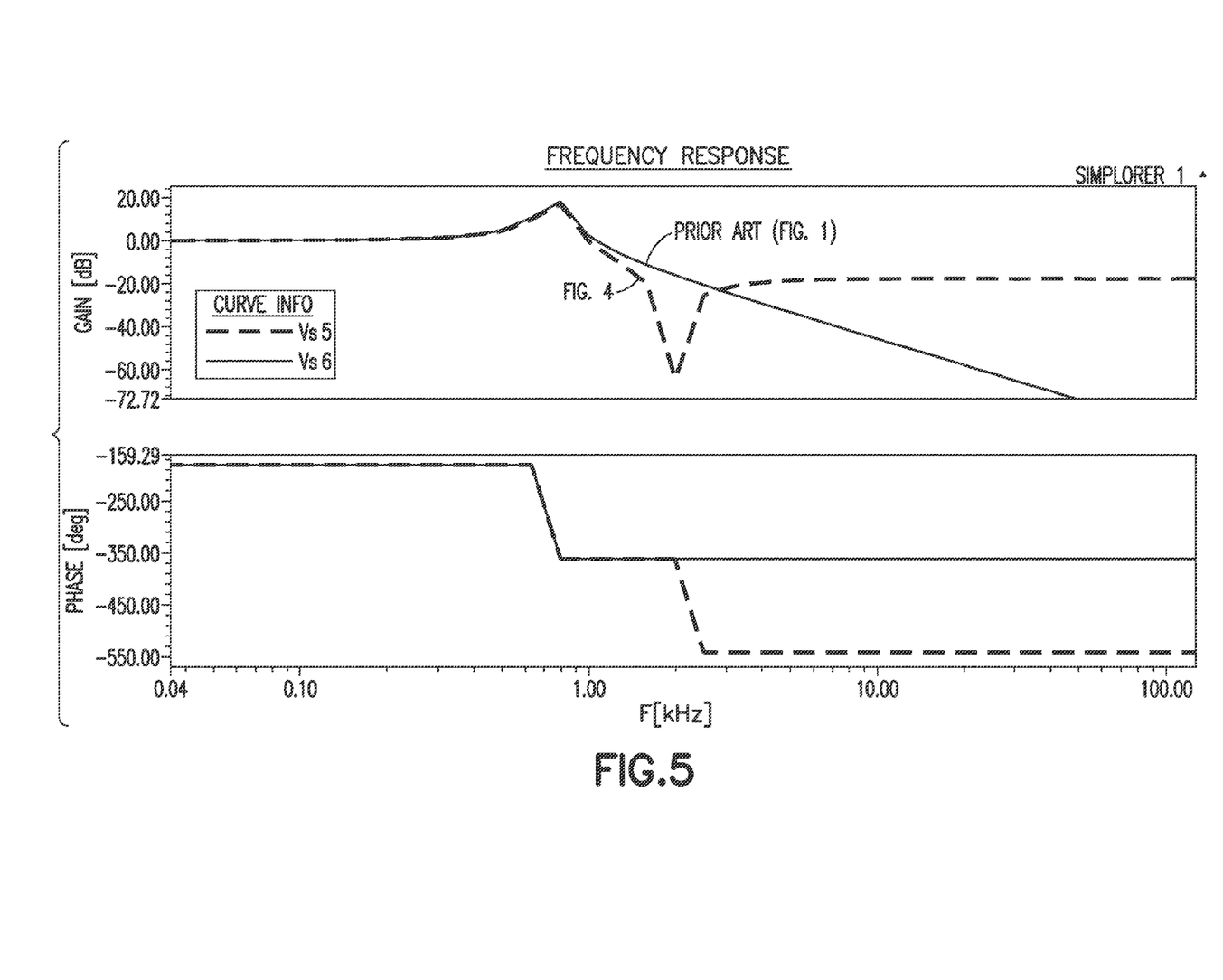
FIG. 5 is a graph of frequency response for a sine wave filter in accordance with an embodiment of the present disclosure compared to a prior art filter.

FIG. 5 shows the difference in frequency response between a prior art drive output filter, e.g., as shown in FIG. 1 and the filter 210 shown in FIG. 4. FIG. 5 shows that the prior art filter F exhibits a gradual response, whereas the filter 210 exhibits an optimal attenuation at a specific frequency, in the example shown in FIG. 4a, 2 kHz.

Figure 6:
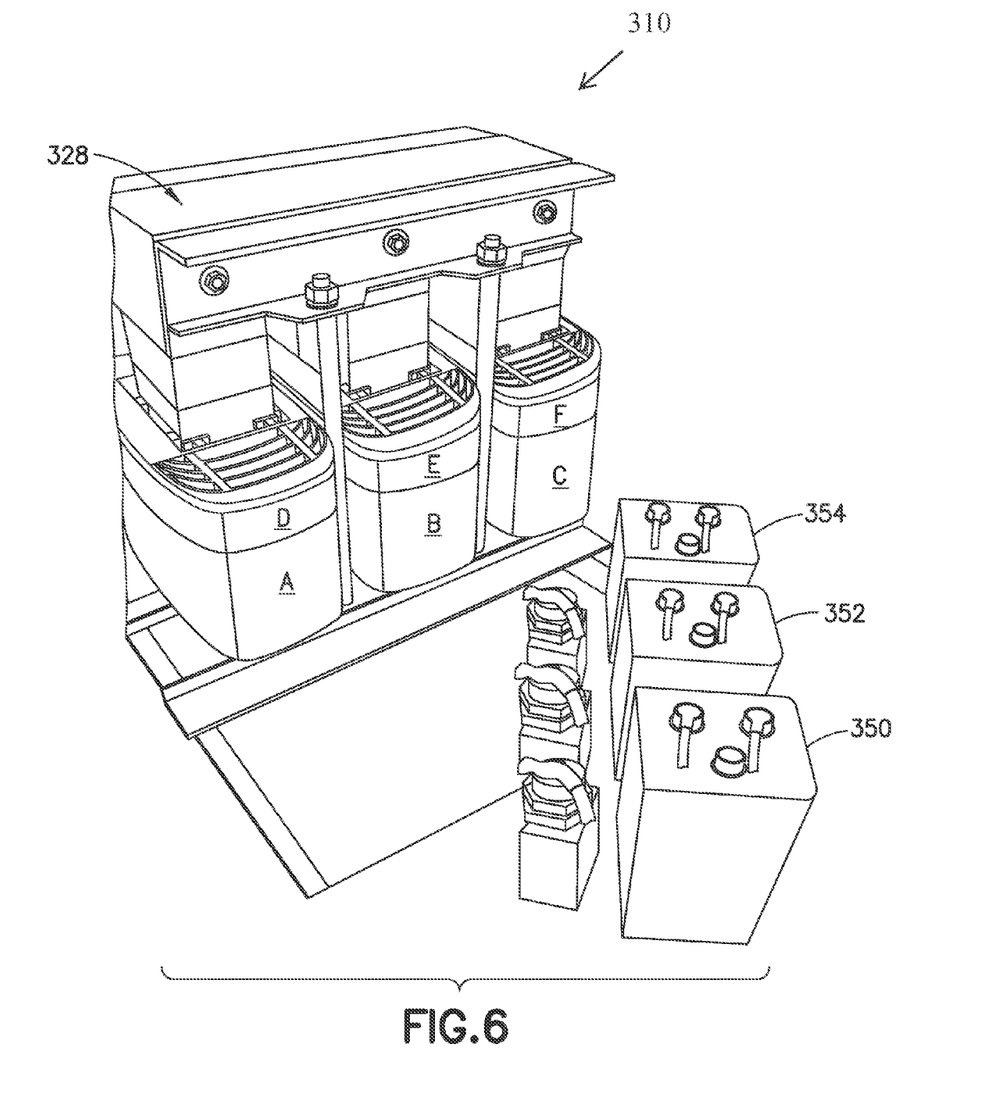
FIG. 6 is a rear perspective view of a sine wave filter in accordance with an embodiment of the present disclosure.
Figure 7:
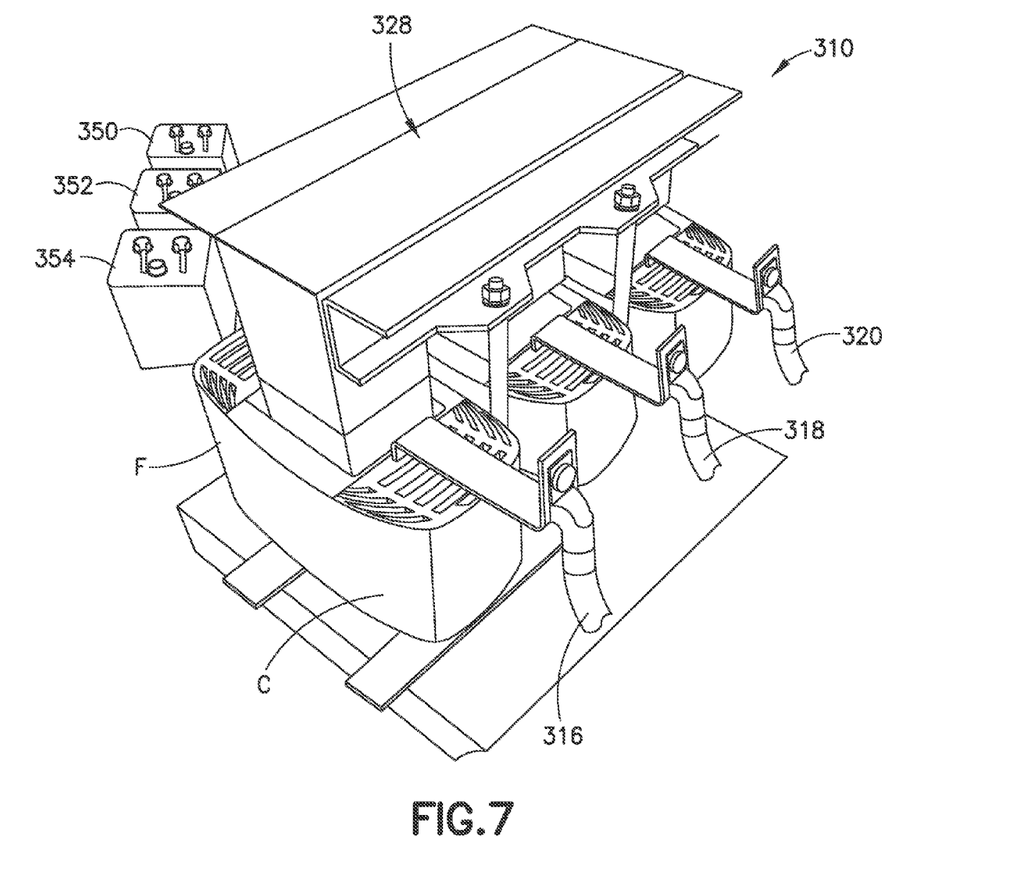
FIG. 7 is a front perspective view of a sine wave filter in accordance with an embodiment of the present disclosure.

FIGS. 6 and 7 show a filter 310 in accordance with an embodiment of the present disclosure where additional damping by resistors is omitted consistent with the circuit shown in FIG. 4. The filter 310 includes a core 328 and capacitors 350, 352, and 354. The A, B and C windings of the filter 310 may be constructed from multiple turns, e.g., twelve, of insulated 7.5"×0.035" copper sheet. The D, E and F windings of the filter 310 may be wound with, e.g., four turns of biflar 0.102"×0.204" magnet wires. In one embodiment, the filter 310 may be used as a filter for a 480 V motor rated at 415 A, which is connected to the filter 310 via lines 316, 318, 320. The present invention is explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification, include illustrative embodiments of the present invention and illustrate various objects and features thereof. Further, the figures are not necessarily to scale, in that some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Detailed embodiments of the present invention are disclosed herein, however, it is to be understood that the disclosed embodiments are merely illustrative of the invention that may be embodied in various forms. In addition, each of the examples given in connection with the various embodiments of the invention are intended to be illustrative, and not restrictive. Any alterations and further modifications of the inventive feature illustrated herein, and any additional applications of the principles of the invention as illustrated herein, which would normally occur to one skilled in the relevant art and having possession of this disclosure, are to be considered within the scope of the invention.

Throughout the specification and claims, the following terms take the meanings explicitly associated herein, unless the context clearly dictates otherwise. The phrases "an embodiment" and "in some embodiments" as used herein do not necessarily refer to the same embodiment(s), though it may. Furthermore, the phrases "another embodiment" and "in some other embodiments" if used herein, do not necessarily refer to a different embodiment, although it may. Various embodiments of the invention may be readily combined, without departing from the scope or spirit of the invention.

In addition, as used herein, the term "or" is an inclusive "or" operator, and is equivalent to the term "and/or," unless the context clearly dictates otherwise. In addition, throughout the specification, the meaning of "a," "an," and "the" include plural references. The meaning of "in" includes "in" and "on."

It will be understood that the embodiments described herein are merely exemplary and that a person skilled in the art may make many variations and modifications without departing from the spirit and scope of the claimed subject matter. For example, while an iron/steel core is shown for coils A, B, C, D, E, F in FIGS. 2-4, a ferrite core could be used. All such variations and modifications are intended to be included within the scope of the appended claims.

We claim:

1. A device for modifying an input electrical waveform generated by a source of electrical power provided on a first conductor, comprising:
   a first inductor capable of connecting to the first conductor;
   a second inductor connected in series to the first inductor distal to the first conductor;
   a capacitor connected in series with the second inductor distal to the first inductor;
   a second conductor connected between the first inductor and the second inductor, the second conductor capable of presenting an output waveform;
   wherein at least one of the first and second inductors is an adaptive passive inductor.

2. The device of claim 1, wherein a relative polarity between the first inductor and the second inductor is additive.

3. The device claim 2, wherein the input electrical waveform is a first electrical waveform and wherein the source of electrical power produces a plurality of electrical waveforms, each provided on one of a plurality of conductors and further comprising a plurality of devices, each having a first inductor capable of connecting to one of the plurality of conductors, a second inductor connected in series to the first inductor, a capacitor connected in series with the second inductor distal to the first inductor and a plurality of second conductors connected between the first inductor and the second inductor, the plurality of second conductors capable of presenting a multi-phase output waveform.

4. The device of claim 3, wherein the plurality of electrical waveforms is three in number, each having a different phase to provide three-phase electrical power at three second conductors.

5. The device of claim 2, wherein the first inductor and the second inductor are disposed on a common core.

6. The device of claim 4, wherein each of the series connected first inductors and second inductors are disposed on a common core.

7. The device of claim 1, wherein the source of electrical power is an adjustable speed drive.

8. The device of claim 4, wherein the output waveform is supplied to an electric motor.

9. The device of claim 1, wherein the device reduces harmonic currents being present in the second inductor.

10. The device of claim 1, further comprising a resistor interposed between and in series with the second inductor and the capacitor.

11. The device of claim 1, wherein each of the first and second inductors is an adaptive passive inductor.

12. The device of claim 11, further comprising an E-shaped core each of the first and second inductors being wound about a corresponding leg of the E-shaped core and further comprising an I-shaped core disposed proximate to ends of each leg of the E-shaped core and further comprising a high permeability core gap piece disposed between each leg of the E-shaped core and the I-shaped core.

13. A filter for filtering an input electrical power waveform to produce an output power waveform, comprising:
- an inductor having first and second coils,
- a capacitor connected in series,
- tap terminal intermediate first and second inductors,
- a conductor, extending from the tap terminal and being capable of being connected to a load;
- wherein the input electrical power is provided by an adjustable speed drive and the load is a motor; and
- wherein the inductor is an adaptive passive inductor and comprising a resistor connected in series between the inductor and the capacitor.

14. The filter of claim 13, wherein the input electrical power is provided by an adjustable speed drive and the load is a motor.

15. A filter for filtering a three-phase electrical power waveform to produce a three-phase output power waveform, comprising:
- an inductor, having three sets of first and second coils, each set of coils having a capacitor connected in series therewith, each of the capacitors is connected in common distal to a respective series connection with a respective second coil, each of the three sets of first and second coils having respective tap intermediate first and second coils where the output waveform is present, each tap intermediate coil being capable of being connected to a load;
- wherein the inductor is passive adaptive inductor and further comprising a resistor connected in series between the inductor and the capacitor, the load being a three-phase electric motor; and
- wherein the inductor is formed on an E-shaped core, each of the three sets of first and second coils being wound on a corresponding leg of the E-shaped core.

16. The device of claim 1, further comprising a three phase core, each of the first and second inductors being wound about a corresponding portion of the three phase core.

* * * * *